US012717200B2

(12) United States Patent
Amundson et al.

(10) Patent No.: US 12,717,200 B2
(45) Date of Patent: Aug. 25, 2026

(54) ELECTROPHORETIC DISPLAY HAVING DIELECTRIC COATING ON ELECTRODE

(71) Applicant: E INK CORPORATION, Billerica, MA (US)

(72) Inventors: Karl Raymond Amundson, Cambridge, MA (US); Kosta Ladavac, Somerville, MA (US); Stephen J. Telfer, Arlington, MA (US); Dan John Lauber, Somerville, MA (US); Darwin Scott Bull, Harvard, MA (US)

(73) Assignee: E INK CORPORATION, Billerica, MA (US)

( * ) Notice: Subject to any disclaimer, the term of this patent is extended or adjusted under 35 U.S.C. 154(b) by 829 days.

(21) Appl. No.: 17/876,217

(22) Filed: Jul. 28, 2022

(65) Prior Publication Data

US 2023/0040814 A1 Feb. 9, 2023

Related U.S. Application Data

(60) Provisional application No. 63/229,159, filed on Aug. 4, 2021.

(51) Int. Cl.
*G02F 1/167* (2019.01)
*G02F 1/1343* (2006.01)
(Continued)

(52) U.S. Cl.
CPC ........ *G02F 1/167* (2013.01); *G02F 1/134309* (2013.01); *G02F 1/16757* (2019.01);
(Continued)

(58) Field of Classification Search
CPC ............................ G02F 1/167; G02F 1/16756
See application file for complete search history.

(56) References Cited

U.S. PATENT DOCUMENTS 4,418,346 A 11/1983 Batchelder
5,872,552 A 2/1999 Gordon, II et al.
(Continued)

FOREIGN PATENT DOCUMENTS

JP 2009271387 A * 11/2009
JP 2012225981 A 11/2012
(Continued)

OTHER PUBLICATIONS

Korean Intellectual Property Office, "International Search Report and Written Opinion", PCT/US2022/038707, Nov. 11, 2022. Nov. 11, 2022.

(Continued)

*Primary Examiner* — Christopher Stanford
(74) *Attorney, Agent, or Firm* — Quarles & Brady, LLP

(57) ABSTRACT

An electrophoretic display (100) comprises an electrophoretic medium (114) having electrically charged particles disposed in a fluid and capable of moving through the fluid on application of an electric field. An electrode (104, 120) is disposed adjacent the electrophoretic medium and arranged to apply an electric field thereto. A dielectric layer (106, 118) is disposed between the electrophoretic medium (114) and the electrode (104, 120) and has at least one aperture (107, 119) extending therethrough. The provision of the apertures (107, 119) in the dielectric layers enables the dielectric layers (106, 118) to protect the electrodes (104, 120) while reducing electro-optical kickback. When multiple electrodes (104, 120) are present adjacent the electrophoretic medium (114), more than one or all of the electrodes (104, 120) may be provided with apertured dielectric layers (106, 118).

10 Claims, 4 Drawing Sheets

(51) Int. Cl.
*G02F 1/16757* (2019.01)
*G02F 1/1676* (2019.01)
*G03F 7/00* (2006.01)

(52) U.S. Cl.
CPC .......... *G02F 1/1676* (2019.01); *G03F 7/0007* (2013.01); *G02F 2201/50* (2013.01); *G02F 2202/022* (2013.01); *G02F 2202/28* (2013.01)

(56) References Cited

U.S. PATENT DOCUMENTS 6,017,584 A 1/2000 Albert et al.
6,124,851 A 9/2000 Jacobson
6,130,773 A 10/2000 Jacobson et al.
6,130,774 A 10/2000 Albert et al.
6,144,361 A 11/2000 Gordon, II et al.
6,177,921 B1 1/2001 Comiskey et al.
6,184,856 B1 2/2001 Gordon, II et al.
6,225,971 B1 5/2001 Gordon, II et al.
6,232,950 B1 5/2001 Albert et al.
6,252,564 B1 6/2001 Albert et al.
6,271,823 B1 8/2001 Gordon, II et al.
6,312,304 B1 11/2001 Duthaler et al.
6,312,971 B1 11/2001 Amundson et al.
6,376,828 B1 4/2002 Comiskey
6,392,786 B1 5/2002 Albert
6,413,790 B1 7/2002 Duthaler et al.
6,422,687 B1 7/2002 Jacobson
6,498,114 B1 12/2002 Amundson et al.
6,506,438 B2 1/2003 Duthaler et al.
6,518,949 B2 2/2003 Drzaic
6,535,197 B1 3/2003 Comiskey et al.
6,545,291 B1 4/2003 Amundson et al.
6,545,797 B2 4/2003 Chen et al.
6,639,578 B1 10/2003 Comiskey et al.
6,657,772 B2 12/2003 Loxley
6,664,944 B1 12/2003 Albert et al.
D485,294 S 1/2004 Albert
6,683,333 B2 1/2004 Kazlas et al.
6,724,519 B1 4/2004 Comiskey et al.
6,788,452 B2 9/2004 Liang et al.
6,816,147 B2 11/2004 Albert
6,819,471 B2 11/2004 Amundson et al.
6,825,068 B2 11/2004 Denis et al.
6,831,769 B2 12/2004 Holman et al.
6,842,279 B2 1/2005 Amundson
6,842,657 B1 1/2005 Drzaic et al.
6,850,357 B2 2/2005 Kaneko et al.
6,865,010 B2 3/2005 Duthaler et al.
6,866,760 B2 * 3/2005 Paolini, Jr. .............. G02F 1/167 204/450
6,873,452 B2 3/2005 Tseng et al.
6,909,532 B2 6/2005 Chung et al.
6,922,276 B2 7/2005 Zhang et al.
6,967,640 B2 11/2005 Albert et al.
6,980,196 B1 12/2005 Turner et al.
6,982,178 B2 1/2006 LeCain et al.
7,002,728 B2 2/2006 Pullen et al.
7,012,600 B2 3/2006 Zehner et al.
7,012,735 B2 3/2006 Honeyman
7,030,412 B1 4/2006 Drzaic et al.
7,038,656 B2 5/2006 Liang et al.
7,038,670 B2 5/2006 Liang et al.
7,046,228 B2 5/2006 Liang et al.
7,052,571 B2 5/2006 Wang et al.
7,072,095 B2 7/2006 Liang et al.
7,075,502 B1 7/2006 Drzaic et al.
7,075,703 B2 7/2006 O'Neil et al.
7,106,296 B1 9/2006 Jacobson
7,110,163 B2 9/2006 Webber et al.
7,116,318 B2 10/2006 Amundson et al.
7,119,772 B2 10/2006 Amundson et al.
7,144,942 B2 12/2006 Zang et al.
7,148,128 B2 12/2006 Jacobson
7,167,155 B1 1/2007 Albert et al.
7,170,670 B2 1/2007 Webber
7,173,752 B2 2/2007 Doshi et al.
7,176,880 B2 2/2007 Amundson et al.
7,190,008 B2 3/2007 Amundson et al.
7,206,119 B2 4/2007 Honeyman et al.
7,223,672 B2 5/2007 Kazlas et al.
7,230,751 B2 6/2007 Whitesides et al.
7,256,766 B2 8/2007 Albert et al.
7,259,744 B2 8/2007 Arango et al.
7,301,693 B2 11/2007 Chaug et al.
7,304,780 B2 12/2007 Liu et al.
7,312,784 B2 12/2007 Baucom et al.
7,327,346 B2 2/2008 Chung et al.
7,327,511 B2 2/2008 Whitesides et al.
7,347,957 B2 3/2008 Wu et al.
7,352,353 B2 4/2008 Albert et al.
7,365,733 B2 4/2008 Duthaler et al.
7,382,363 B2 6/2008 Albert et al.
7,385,751 B2 6/2008 Chen et al.
7,388,572 B2 6/2008 Duthaler et al.
7,401,758 B2 7/2008 Liang et al.
7,411,719 B2 8/2008 Paolini, Jr. et al.
7,442,587 B2 10/2008 Amundson et al.
7,453,445 B2 11/2008 Amundson
7,492,497 B2 2/2009 Paolini, Jr. et al.
7,492,505 B2 2/2009 Liang et al.
7,504,050 B2 * 3/2009 Weng ...................... G02F 1/167 252/502
7,535,624 B2 5/2009 Amundson et al.
7,551,346 B2 6/2009 Fazel et al.
7,554,712 B2 6/2009 Patry et al.
7,560,004 B2 7/2009 Pereira et al.
7,580,181 B2 8/2009 Ohshima et al.
7,583,427 B2 9/2009 Danner et al.
7,598,173 B2 10/2009 Ritenour et al.
7,605,799 B2 10/2009 Amundson et al.
7,615,325 B2 11/2009 Liang et al.
7,636,191 B2 12/2009 Duthaler et al.
7,649,674 B2 1/2010 Danner et al.
7,667,886 B2 2/2010 Danner et al.
7,672,040 B2 3/2010 Sohn et al.
7,679,814 B2 3/2010 Paolini, Jr. et al.
7,688,497 B2 3/2010 Danner et al.
7,715,088 B2 5/2010 Liang et al.
7,791,789 B2 9/2010 Albert et al.
7,830,592 B1 11/2010 Sprague et al.
7,839,564 B2 11/2010 Whitesides et al.
7,880,958 B2 2/2011 Zang et al.
7,893,435 B2 2/2011 Kazlas et al.
7,905,977 B2 3/2011 Qi et al.
7,910,175 B2 3/2011 Webber
7,952,790 B2 5/2011 Honeyman et al.
7,981,989 B2 7/2011 Yan et al.
7,982,941 B2 7/2011 Lin et al.
7,986,450 B2 7/2011 Cao et al.
8,009,348 B2 8/2011 Zehner et al.
8,018,642 B2 9/2011 Yeo et al.
8,040,594 B2 10/2011 Paolini, Jr. et al.
8,049,947 B2 11/2011 Danner et al.
8,054,526 B2 11/2011 Bouchard
8,072,675 B2 12/2011 Lin et al.
8,098,418 B2 1/2012 Paolini, Jr. et al.
8,120,836 B2 2/2012 Lin et al.
8,159,636 B2 4/2012 Sun et al.
8,237,892 B1 8/2012 Sprague et al.
8,338,555 B2 12/2012 Yan et al.
8,362,488 B2 1/2013 Chaug et al.
8,363,299 B2 1/2013 Paolini, Jr. et al.
8,395,836 B2 3/2013 Lin
8,422,116 B2 4/2013 Sprague et al.
8,437,069 B2 5/2013 Lin
8,441,414 B2 5/2013 Lin
8,441,432 B2 5/2013 Zang et al.
8,456,589 B1 6/2013 Sprague et al.
8,503,063 B2 8/2013 Sprague
8,514,168 B2 8/2013 Chung et al.
8,547,628 B2 10/2013 Wu et al.
8,576,162 B2 11/2013 Kang
8,576,470 B2 11/2013 Paolini, Jr. et al.

(56) References Cited

U.S. PATENT DOCUMENTS 8,576,475 B2 11/2013 Huang et al.
8,605,354 B2 12/2013 Zhang et al.
8,610,988 B2 12/2013 Zehner et al.
8,649,084 B2 2/2014 Wang et al.
8,670,174 B2 3/2014 Sprague et al.
8,704,756 B2 4/2014 Lin
8,714,780 B2 5/2014 Ho et al.
8,717,664 B2 5/2014 Wang et al.
8,728,266 B2 5/2014 Danner et al.
8,743,077 B1 6/2014 Sprague
8,754,859 B2 6/2014 Gates et al.
8,786,935 B2 7/2014 Sprague
8,797,258 B2 8/2014 Sprague
8,797,633 B1 8/2014 Sprague et al.
8,797,634 B2 8/2014 Paolini, Jr. et al.
8,797,636 B2 8/2014 Yang et al.
8,873,129 B2 10/2014 Paolini, Jr. et al.
8,896,905 B2 11/2014 Verschueren et al.
8,902,153 B2 12/2014 Bouchard et al.
8,902,491 B2 12/2014 Wang et al.
8,917,439 B2 12/2014 Wang et al.
8,937,301 B2 1/2015 Quinn et al.
8,964,282 B2 2/2015 Wang et al.
9,013,783 B2 4/2015 Sprague
9,025,234 B2 5/2015 Lin
9,025,238 B2 5/2015 Chan et al.
9,030,374 B2 5/2015 Sprague et al.
9,082,981 B1 7/2015 Lu et al.
9,116,412 B2 8/2015 Lin
9,140,952 B2 9/2015 Sprague et al.
9,146,439 B2 9/2015 Zhang
9,152,004 B2 10/2015 Paolini, Jr. et al.
9,170,468 B2 10/2015 Lin et al.
9,182,646 B2 11/2015 Paolini, Jr. et al.
9,195,111 B2 11/2015 Anseth et al.
9,199,441 B2 12/2015 Danner
9,201,279 B2 12/2015 Wu et al.
9,217,906 B2 12/2015 Yeo et al.
9,223,164 B2 12/2015 Lai et al.
9,244,325 B2 1/2016 Hayashi et al.
9,279,906 B2 3/2016 Kang
9,285,648 B2 3/2016 Liu et al.
9,285,649 B2 3/2016 Du et al.
9,305,496 B2 4/2016 Kimura
9,310,661 B2 4/2016 Wu et al.
9,341,916 B2 5/2016 Telfer et al.
9,341,948 B2 5/2016 Huang et al.
9,360,733 B2 6/2016 Wang et al.
9,361,836 B1 6/2016 Telfer et al.
9,383,623 B2 7/2016 Lin et al.
9,423,666 B2 8/2016 Wang et al.
9,436,056 B2 9/2016 Paolini, Jr. et al.
9,454,057 B2 9/2016 Wu et al.
9,459,510 B2 10/2016 Lin
9,513,527 B2 12/2016 Chan et al.
9,529,240 B2 12/2016 Paolini, Jr. et al.
9,541,814 B2 1/2017 Lin et al.
9,582,041 B2 2/2017 Cheng et al.
9,620,066 B2 4/2017 Bishop
9,632,373 B2 4/2017 Huang et al.
9,640,119 B2 5/2017 Lin et al.
9,646,547 B2 5/2017 Lin et al.
9,666,142 B2 5/2017 Hung
9,671,635 B2 6/2017 Paolini, Jr.
9,671,668 B2 6/2017 Chan et al.
9,697,778 B2 7/2017 Telfer et al.
9,704,997 B2 7/2017 Quinn et al.
9,715,155 B1 7/2017 Subramanian et al.
9,726,957 B2 8/2017 Telfer et al.
9,759,980 B2 9/2017 Du et al.
9,777,201 B2 10/2017 Widger et al.
9,779,670 B2 10/2017 Uesaka et al.
9,779,671 B2 10/2017 Gan et al.
9,812,073 B2 11/2017 Lin et al.
9,897,890 B2 2/2018 Whitehead
9,897,891 B2 2/2018 Harris et al.
9,921,422 B2 3/2018 Danner et al.
9,921,451 B2 3/2018 Telfer et al.
9,922,603 B2 3/2018 Lin
9,923,158 B2 3/2018 Quinn et al.
9,939,707 B2 4/2018 Loxley et al.
9,964,831 B2 * 5/2018 Whitesides .......... C08G 18/765
10,032,419 B2 7/2018 Lin et al.
10,036,929 B2 7/2018 Du et al.
10,036,930 B2 7/2018 Whitesides et al.
10,037,735 B2 7/2018 Amundson
10,048,563 B2 8/2018 Paolini, Jr. et al.
10,048,564 B2 8/2018 Paolini, Jr. et al.
10,147,895 B2 12/2018 Lu et al.
10,162,242 B2 12/2018 Wang et al.
10,190,743 B2 1/2019 Hertel et al.
10,209,556 B2 2/2019 Rosenfeld et al.
10,276,109 B2 4/2019 Crounse et al.
10,324,577 B2 6/2019 Sainis et al.
10,332,435 B2 6/2019 Wang et al.
10,339,876 B2 7/2019 Lin et al.
10,353,266 B2 7/2019 Bouchard et al.
10,365,533 B2 7/2019 Matsumoto
10,366,647 B2 7/2019 Szymborski
10,372,008 B2 8/2019 Telfer et al.
10,380,931 B2 8/2019 Lin et al.
10,380,955 B2 8/2019 Lin
10,431,168 B2 10/2019 Lin et al.
10,444,592 B2 10/2019 Bouchard
10,446,585 B2 10/2019 Harris et al.
10,466,564 B2 11/2019 Kayal et al.
10,466,565 B2 11/2019 Anseth et al.
10,467,984 B2 11/2019 Buckley et al.
10,475,396 B2 11/2019 Sim et al.
10,495,941 B2 12/2019 Hashimoto et al.
10,503,041 B2 12/2019 Harris et al.
10,509,294 B2 12/2019 Telfer
10,551,745 B2 2/2020 Zheng et al.
10,613,407 B2 4/2020 Lin et al.
11,675,244 B2 6/2023 Visani et al.
11,827,816 B2 11/2023 Bzowej et al.
11,959,007 B2 4/2024 Meyer et al.
2002/0060321 A1 5/2002 Kazlas et al.
2004/0085619 A1 5/2004 Wu et al.
2004/0105036 A1 6/2004 Danner et al.
2005/0122306 A1 6/2005 Wilcox et al.
2005/0122563 A1 6/2005 Honeyman et al.
2006/0255322 A1 11/2006 Wu et al.
2008/0043318 A1 2/2008 Whitesides et al.
2009/0122389 A1 5/2009 Whitesides et al.
2009/0225398 A1 9/2009 Duthaler et al.
2010/0156780 A1 6/2010 Jacobson et al.
2010/0177396 A1 7/2010 Lin
2011/0043543 A1 2/2011 Chen et al.
2011/0085227 A1 4/2011 Verschueren
2011/0140744 A1 6/2011 Kazlas et al.
2011/0292319 A1 12/2011 Cole
2014/0055840 A1 2/2014 Zang et al.
2014/0078024 A1 3/2014 Paolini, Jr. et al.
2014/0078576 A1 3/2014 Sprague
2014/0192000 A1 7/2014 Hung et al.
2014/0210701 A1 7/2014 Wu et al.
2015/0005720 A1 1/2015 Zang et al.
2015/0268531 A1 9/2015 Wang et al.
2015/0301246 A1 10/2015 Zang et al.
2016/0012710 A1 1/2016 Lu et al.
2016/0077375 A1 3/2016 Lin
2016/0349592 A1 12/2016 Goulding et al.
2020/0004097 A1 1/2020 Duthaler et al.
2020/0117069 A1 4/2020 Telfer et al.
2020/0118069 A1 4/2020 Furusawa
2022/0084473 A1 3/2022 Telfer et al.

FOREIGN PATENT DOCUMENTS

WO 1999067678 A2 12/1999
WO 2000005704 A1 2/2000

(56) References Cited

FOREIGN PATENT DOCUMENTS

| | | | | |
|---|---|---|---|---|
| WO | 2000038000 | A1 | 6/2000 | |
| WO | WO-2019182186 | A1 * | 9/2019 | ......... G01N 15/1056 |

OTHER PUBLICATIONS

European Patent Office, "Extended European Search Report", EP Appl. No. 22853727.0, Jun. 2, 2025.

* cited by examiner

ELECTROPHORETIC DISPLAY HAVING DIELECTRIC COATING ON ELECTRODE

REFERENCE TO RELATED APPLICATIONS

The application claims benefit of provisional Application Ser. No. 63/229,159, filed Aug. 4, 2021.

This application is related to U.S. Pat. Nos. 9,726,957 and 10,520,786, and Published Application No. 2020/0117069 A1.

The entire contents of the aforementioned provisional application, patents and published application, and of all other U.S. patents and published and copending applications mentioned below, are herein incorporated by reference.

BACKGROUND OF INVENTION

This invention relates to an electrophoretic display in which at least one electrode bears a dielectric coating. More specifically, this invention relates to such an electrophoretic display in which the dielectric coating is provided with at least one aperture therethrough.

Particle-based electrophoretic displays have an electrophoretic medium comprising a plurality of charged particles, which move through a fluid under the influence of an electric field. Electrophoretic displays can have attributes of good brightness and contrast, wide viewing angles, state bistability, and low power consumption when compared with liquid crystal displays. Typically, an electrophoretic display comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

In an electrophoretic display having a electrophoretic medium sandwiched between two electrode layers, at least one of the electrode layers must be light-transmissive, and preferably essentially transparent, to allow changes in the optical state of the medium to be visible to an observer viewing the display through the light-transmissive electrode layer. When one electrode layer is a single continuous electrode and the other is patterned to form pixel electrodes, it is normally the continuous electrode that forms the viewing surface through which the display is viewed, since a single continuous electrode layer is less likely to produce visual artifacts than a patterned electrode layer. The number of materials which possess the necessary combination of electrical conductivity and light-transmissivity to form such electrodes is limited, and most commercial electrophoretic displays use light-transmissive electrode layers formed from sputtered metal oxides, such as indium oxide or indium tin oxide, although electrode layers formed from conductive polymers are also used. To ensure adequate transparency, sputtered metal oxide electrode layers are typically less than 1 nm thick.

It has long been known that electrode layers in electrophoretic displays are susceptible to both mechanical and electrochemical damage. See, for example, U.S. Pat. No. 6,724,519, which describes an electrophoretic display with a protective layer adapted to prevent mechanical or electrochemical damage to an electrode. The protective layer may comprise a metal or metal oxide. See also U.S. Pat. No. 8,441,432, which describes a microcell electrophoretic display in which at least one electrode has an electrode protecting layer formed from a composition comprising a polar oligomeric or polymeric material which comprises at least one polar group selected from the group consisting of nitro, hydroxyl, alkoxy, halo, cyano, sulfonate, amino containing or amino-derived polar groups, carbohydrate groups, phosphorus containing polar groups, sulfur containing polar groups, and anions; wherein said display cells or said electrode protecting layer have a resistivity in the range of about $10^7$ to about $10^{12}$ ohm cm. U.S. Pat. No. 9,244,325 describes a microcell electrophoretic display having a partition structure dividing the display layer into a plurality of regions, and an electrode protection layer integrally formed with the partition structure, both being mainly composed of an electroconductive polymer, which is an ultraviolet-curable polymer having an ethylene oxide side chain. U.S. Pat. No. 3,792,308 describes an electrophoretic display in which one or both electrodes are coated with an insulating layer prepared by coating the electrode with, for example, vinyl acetate resin, polystyrol or gelatin. Finally, U.S. Pat. No. 6,850,357 describes an electrophoretic display having electrode protective layers formed from acrylic photosensitive resins, non-photosensitive resins and inorganic insulating layers.

Designing a protective layer to protect electrodes in an electrophoretic display against mechanical damage is relatively straightforward, but protecting against electrochemical damage is more complicated. As already noted, electrophoretic displays are typically bistable. (The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states. This type of display is properly called "multi-stable" rather than bistable, although for convenience the term "bistable" may be used herein to cover both bistable and multi-stable displays.) Indeed, such bistability is an important factor in reducing the power consumption of portable, battery-powered electrophoretic displays, since the display can be driven for perhaps 0.5 seconds to display a first image (for example, the first page of a book), left undriven for perhaps 30 seconds while the user reads or inspects the first image, driven for perhaps 0.5 seconds to display a second image, and so on, so that the display is only being driven for a small proportion of the time for which the user is using the display. It has been known for some time that the drive schemes used to drive electrophoretic displays should be DC balanced in the sense that if a specific pixel of the display starts from an initial gray level and undergoes a series of transitions which visit other gray levels but end up at the initial gray level, the overall impulse (the integral of the drive voltage with respect to time) of the series of transitions should be substantially zero. If this is not the case, after lengthy use the display is likely to exhibit permanent electrochemical changes at the electrode layers, and these changes may damage or even destroy the electro-optic performance of the display.

Even if the overall drive scheme is DC balanced, however, problems can still arise if the waveforms used for individual transitions are not themselves DC balanced. Often, electrophoretic displays show a "remnant voltage" after driving. This remnant voltage, which is measured as the open circuit voltage across the electrodes of the display, is believed to be due to a buildup of charges within the various layers of the electrophoretic display, and can persist for a considerable period after driving of the display concludes. Remnant voltage can lead to unwanted changes in the optical state of the display during periods when the display is not being driven, and is intended to remain in the same optical state. Even small remnant voltages can cause problems since most electrophoretic media have little or no threshold voltage, so that the presence of even a small remnant voltage for an extended period between two successive transitions can cause significant change in the optical state of the medium. Such unwanted changes in optical state are especially problematic in full color displays, since the human eye tends to be more sensitive to slight changes in hue than to minor variations in gray level in monochrome displays; in particular, color variation in flesh tones is very noticeable, especially if a greenish tint develops. Although methods are known for reducing or eliminating remnant voltage (see for example U.S. Pat. No. 10,475,396), it is desirable to prevent significant remnant voltages from developing during driving of electrophoretic displays.

To prevent buildup of remnant voltage, electrophoretic displays can be driven using drive schemes in which each waveform is itself DC balanced, i.e., each waveform, as well as the overall drive scheme is DC balanced. However, making all waveforms DC balanced introduces additional complications, especially in the case of full color displays. Typically, DC balanced waveforms comprise a DC balancing section followed by a driving section; the DC balancing section is arranged to have a net impulse equal in magnitude but opposite in polarity to that of the driving section, so that the net impulse of the overall waveform is essentially zero. See, for example, U.S. Pat. No. 10,276,109, FIG. 11, which shows a waveform of this type being used in a four particle (white, yellow, cyan and magenta), full color display. However, not only does the DC balancing section introduce a substantial increase in the duration of the waveform, and hence the time taken for the transition, it also tends to increase the duration of the driving (color-rendering) section. Because the DC balancing section must have a net impulse of opposite polarity to the driving section, the DC balancing section inherently tends to drive the electrophoretic particles in the opposite directions from those in which they will be driven during the driving section, and in practice at the end of the DC balancing section, the electrophoretic particles are disposed in almost the opposite of their desired relative positions. As a result, the driving or color rendering section may need to be long (on the order of many seconds) in order to overcome the particle displacements effected by the DC balancing section.

U.S. Patent Publication No. 2022/0084473 A1 describes DC imbalanced waveforms for driving four particle, full color electrophoretic displays, these waveforms being much shorter that the DC balanced waveforms described in the aforementioned U.S. Pat. No. 10,276,109. However, without mitigation of remnant voltage buildup and electrode degradation, such waveforms could not be used in commercial displays with acceptable lifetimes.

As mentioned above, it is known to protect one or both electrodes of an electrophoretic display by providing a protective (and typically dielectric) layer over the electrode. However, such a dielectric layer introduces a capacitor in series with the electrophoretic medium between the two electrodes of the display. This capacitor becomes charged as the electrophoretic display is driven and when, at the end of the waveform, the two electrodes are set to the same potential (to reduce the electric field across the electrophoretic medium to zero, and thus to keep the electrophoretic medium at the desired optical state), discharge of this capacitor may cause enough current to flow through the electrophoretic medium to cause a significant and objectionable change in its optical state, a phenomenon known as "electro-optical kickback". The present invention seeks to provide the advantages of such dielectric layers while reducing or eliminating the problem of kickback.

SUMMARY OF INVENTION

Accordingly, this invention provides an electrophoretic display comprising: an electrophoretic medium comprising a plurality of electrically charged particles disposed in a fluid and capable of moving through the fluid on application of an electric field to the electrophoretic medium; an electrode disposed adjacent the electrophoretic medium and arranged to apply an electric field thereto; and a dielectric layer disposed between the electrophoretic medium and the electrode, the dielectric layer having at least one aperture extending therethrough.

The electrophoretic display of the present invention may, and typically will, comprise a second electrode disposed on the opposite side of the electrophoretic medium from the electrode adjacent the dielectric layer. A second dielectric layer may be disposed between the electrophoretic medium and the second electrode, the second dielectric layer having at least one aperture extending therethrough. The dielectric layer may have a dielectric strength of at least about $10^7$ V/M. Also, the dielectric layer may have a thickness in the range of about 10 to 100 nm and the at least one aperture may be substantially circular and have a diameter in the range of about 1 to 5 μm. The dielectric layer may be formed from any one or more of silicon dioxide, silicon nitride, a metal oxide, or an organic material, for example any one of more of zinc oxide, tantalum oxide, hafnium oxide, perylene or a photoresist.

The electrophoretic display of the present invention may further comprise an adhesive layer disposed between the dielectric layer and the electrophoretic medium. This adhesive layer may be doped with an ionic material to reduce its electrical resistance.

The electrophoretic display of the present invention may be encapsulated or unencapsulated, and when encapsulated may be of any of the types known in the art; for example, the electrically charged particles and the fluid may be confined within a plurality of capsules or microcells, or may be present as a plurality of discrete droplets surrounded by a continuous phase comprising a polymeric material.

The electrophoretic display of the present invention may have a plurality of electrodes disposed adjacent the electrophoretic medium, and the display may comprising voltage control means to vary the potential of the plurality of electrodes independently of one another. The dielectric layer may be provided with a plurality of apertures extending to each of the plurality of electrodes, each of the plurality of electrodes having a central region and a peripheral region, the size and/or number of apertures per unit area being greater in the central region than in the peripheral region.

This invention also provides a process for producing an electrophoretic display of the present invention. This process comprises: providing an electrode; coating the electrode with a photoresist; imagewise exposing the photoresist to radiation; washing the exposed photoresist, thereby forming at least one aperture through the exposed photoresist; and disposing the electrophoretic medium adjacent the exposed photoresist. In this process, the photoresist may be a cinnamate photoresist.

DETAILED DESCRIPTION

Figure 1:
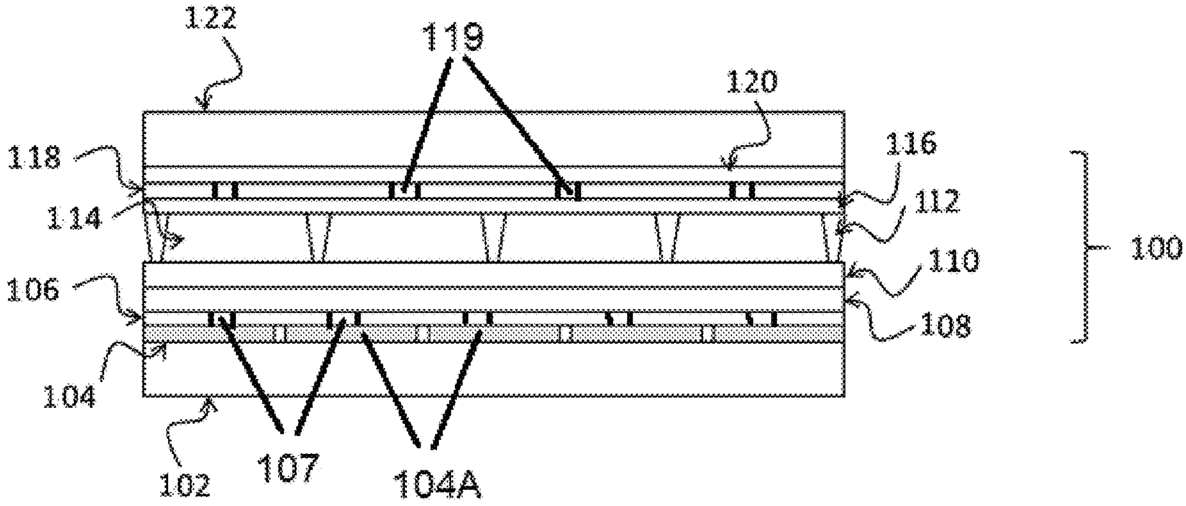
FIG. 1 of the accompanying drawings is a schematic cross-section through a microcell electrophoretic display of the present invention.

As already mentioned, this invention provides an electrophoretic display comprising: an electrophoretic medium, an electrode disposed adjacent the electrophoretic medium, and a dielectric layer disposed between the electrophoretic medium and the electrode, the dielectric layer having at least one aperture extending therethrough.

The electrophoretic medium and electrode used in the present invention may be of any of the types known in the art. Numerous patents and applications assigned to or in the names of the Massachusetts Institute of Technology (MIT), E Ink Corporation, E Ink California, LLC. and related companies describe various technologies used in encapsulated and microcell electrophoretic and other electro-optic media. Encapsulated electrophoretic media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. In a microcell electrophoretic display, the charged particles and the fluid are not encapsulated within microcapsules but instead are retained within a plurality of cavities formed within a carrier medium, typically a polymeric film. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Microcell structures, wall materials, and methods of forming microcells; see for example U.S. Pat. Nos. 7,072,095 and 9,279,906;

(d) Methods for filling and sealing microcells; see for example U.S. Pat. Nos. 7,144,942 and 7,715,088;

(e) Films and sub-assemblies containing electro-optic materials; see for example U.S. Pat. Nos. 6,982,178 and 7,839,564;

(f) Backplanes, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,873,452; 6,909,532; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,301,693; 7,304,780; 7,327,346; 7,327,511; 7,347,957; 7,349,148; 7,352,353; 7,365,394; 7,365,733; 7,382,363; 7,388,572; 7,401,758; 7,442,587; 7,492,497; 7,535,624; 7,551,346; 7,554,712; 7,560,004; 7,583,427; 7,598,173; 7,605,799; 7,636,191; 7,649,674; 7,667,886; 7,672,040; 7,688,497; 7,733,335; 7,785,988; 7,830,592; 7,839,564; 7,843,626; 7,859,637; 7,880,958; 7,893,435; 7,898,717; 7,905,977; 7,957,053; 7,986,450; 8,009,344; 8,027,081; 8,049,947; 8,072,675; 8,077,141; 8,089,453; 8,120,836; 8,159,636; 8,208,193; 8,237,892; 8,238,021; 8,362,488; 8,373,211; 8,389,381; 8,395,836; 8,437,069; 8,441,414; 8,456,589; 8,498,042; 8,514,168; 8,547,628; 8,576,162; 8,610,988; 8,714,780; 8,728,266; 8,743,077; 8,754,859; 8,797,258; 8,797,633; 8,797,636; 8,830,560; 8,891,155; 8,969,886; 9,147,364; 9,025,234; 9,025,238; 9,030,374; 9,140,952; 9,152,003; 9,152,004; 9,201,279; 9,223,164; 9,285,648; 9,310,661; 9,419,024; 9,454,057; 9,529,240; 9,620,066; 9,632,373; 9,632,389; 9,666,142; 9,671,635; 9,715,155; 9,777,201; 9,778,500; 9,841,653; 9,897,891; 9,910,337; 9,921,422; 9,964,831; 10,036,930; 10,037,735; 10,048,563; 10,048,564; 10,190,743; 10,324,577; 10,365,533; 10,372,008; 10,429,715; 10,446,585; 10,466,564; 10,466,565; 10,495,940; 10,495,941; 10,503,041; and 10,509,294; and U.S. Patent Applications Publication Nos. 2002/0060321; 2004/0085619; 2004/0105036; 2005/0122306; 2005/0122563; 2006/0255322; 2007/0052757; 2009/0122389; 2009/0315044; 2010/0177396; 2011/0140744; 2011/0187683; 2011/

0292319; 2014/0078024; 2014/0192000; 2014/0210701; 2014/0368753; 2015/0378235; and 2016/0077375; and International Application Publication No. WO 00/38000; European Patents Nos. 1,099,207 B1 and 1,145,072 B1;

(g) Color formation and color adjustment; see for example U.S. Pat. Nos. 6,017,584; 6,545,797; 6,664,944; 6,788,452; 6,864,875; 6,914,714; 6,972,893; 7,038,656; 7,038,670; 7,046,228; 7,052,571; 7,075,502; 7,167,155; 7,385,751; 7,492,505; 7,667,684; 7,684,108; 7,791,789; 7,800,813; 7,821,702; 7,839,564; 7,910,175; 7,952,790; 7,956,841; 7,982,941; 8,040,594; 8,054,526; 8,098,418; 8,159,636; 8,213,076; 8,363,299; 8,422,116; 8,441,714; 8,441,716; 8,466,852; 8,503,063; 8,576,470; 8,576,475; 8,593,721; 8,605,354; 8,649,084; 8,670,174; 8,704,756; 8,717,664; 8,786,935; 8,797,634; 8,810,899; 8,830,559; 8,873,129; 8,902,153; 8,902,491; 8,917,439; 8,964,282; 9,013,783; 9,116,412; 9,146,439; 9,164,207; 9,170,467; 9,170,468; 9,182,646; 9,195,111; 9,199,441; 9,268,191; 9,285,649; 9,293,511; 9,341,916; 9,360,733; 9,361,836; 9,383,623; 9,423,666; 9,436,056; 9,459,510; 9,513,527; 9,541,814; 9,552,780; 9,640,119; 9,646,547; 9,671,668; 9,697,778; 9,726,959; 9,740,076; 9,759,981; 9,761,181; 9,778,538; 9,779,670; 9,779,671; 9,812,073; 9,829,764; 9,921,451; 9,922,603; 9,989,829; 10,032,419; 10,036,929; 10,036,931; 10,332,435; 10,339,876; 10,353,266; 10,366,647; 10,372,010; 10,380,931; 10,380,955; 10,431,168; 10,444,592; 10,467,984; 10,475,399; 10,509,293; and 10,514,583; and U.S. Patent Applications Publication Nos. 2008/0043318; 2008/0048970; 2009/0225398; 2010/0156780; 2011/0043543; 2012/0326957; 2013/0242378; 2013/0278995; 2014/0055840; 2014/0078576; 2015/0103394; 2015/0118390; 2015/0124345; 2015/0268531; 2015/0301246; 2016/0026062; 2016/0048054; and 2016/0116818;

(h) Methods for driving displays; see for example U.S. Pat. Nos. 7,012,600 and 7,453,445;

(i) Applications of displays; see for example U.S. Pat. Nos. 7,312,784 and 8,009,348; and (j) Applications of encapsulation and microcell technology other than displays; see for example U.S. Pat. No. 7,615,325; and U.S. Patent Application Publications Nos. 2015/0005720 and 2016/0012710.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, U.S. Pat. No. 6,866,760.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 μm), preferably about 2 to about 10 mil (51 to 254 μm). The electrically-conductive layer is conveniently a thin metal or metal oxide layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E. I. du Pont de Nemours & Company, Wilmington DE, and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well adapted to mass production since the front plane laminate may be mass produced, typically using roll-to-roll coating techniques, and then cut into pieces of any size needed for use with specific backplanes.

U.S. Pat. No. 7,839,564 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin layer of adhesive may or may not be present between the electro-optic layer and a backplane. Such electro-optic displays can combine good resolution with good low temperature performance.

The electrodes in both front plane laminates and inverted front plane laminates may be provided with apertured dielectric layers in accordance with the present invention.

FIG. 1 of the accompanying drawings is a schematic cross-section through a microcell display of the present invention, generally designated 100. A first substrate 102, which may be formed from glass or a polymer, has formed thereon a first electrode layer 104, which is divided into a plurality of pixel electrodes 104A, each of which defines one pixel of the display. The substrate 102 and first electrode layer 104 together form the backplane of the display 100. The pixel electrodes 104A may form part of an active matrix backplane provided with row and column electrodes and transistors associated with each individual pixel electrode 104A, but these conventional components are omitted from FIG. 1 for ease of illustration. Alternatively, the display 100 may be of the direct drive type with each individual pixel electrode 104A provided with a separate voltage supply line (not shown).

A dielectric layer 106 having apertures 107 extending therethrough is in contact with the first electrode layer 104. The number of apertures 107 shown in FIG. 1 is smaller than would typically be used in practice, for ease of illustration. Furthermore, although FIG. 1 shows dielectric layers associated with both electrode layers, the present invention extends to a display in which only one electrode layer has a dielectric layer associated therewith. Surmounting the dielectric layer 106 is an electrically-conductive adhesive layer 108, which is in turn surmounted by a sealing layer 110.

The display 100 further comprises an electrophoretic medium 114, which is confined within microcells defined by a polymeric layer 116, dividing walls 112 and the aforementioned sealing layer 110. The sealing layer 116 is in contact with a second dielectric layer 118 provided with apertures 119, and the second dielectric layer 118 is adhered to a transparent electrode layer 120 formed on a second substrate 122. Again, the number of apertures 119 shown in FIG. 1 is smaller than would typically be used in practice, for ease of illustration. The polymeric layer 116 may comprise a primer layer to assist adhesive on the other components of the microcell layer to the electrode layer 120.

The microcell display shown in FIG. 1 can be produced with only minor modification of the prior art processes for producing and filling microcell displays set out in the patents and applications mentioned above. As there set forth, microcell displays may be produced by first forming electrode 120 on second substrate 122; in practice, films comprising transparent electrode layers on polymeric base films are readily available commercially, and such films can readily be used to form electrode 120 and substrate 122. With the electrode layer 120 upwards, a layer of embossable pre-polymer is then coated over the second electrode 120, and embossed and cured to form the polymeric layer 116 and the dividing walls, 112. The resultant open microcells are then filled with the electrophoretic medium 114, and a pre-polymer film is coated over the microcells and cured to form sealing layer 110. Separately, a backplane comprising layers 102 and 104 is formed, and coated with adhesive layer 208; in practice, this is usually effected off-line, and the adhesive layer 208 is covered with a release film (not shown). The microcell film and the backplane film are then laminated together (after removal of the release film from the backplane film, if necessary), typically in a roll-to-roll lamination process to form the final display as shown in FIG. 1.

This prior art process can readily be modified to incorporate one or both of the apertured dielectric layers 106 and 118 shown in FIG. 1 by (a) coating the dielectric layer 106 over the first electrode layer 104 before the adhesive layer 108 is applied; and/or (b) by coating the dielectric layer 118 over the second electrode layer before the pre-polymer is applied to form the microcells. In principle, an apertured dielectric layer could be incorporated between any two adjacent layers of the display 100 shown in FIG. 1, but in practice it is preferred that the dielectric layer be in contact with the first or second electrode layer 104 or 120, as shown in FIG. 1.

The dielectric layers 104 and 120 may be formed from an organic or inorganic material, for example silicon dioxide, silicon nitride, metal oxides such as zinc oxide, tantalum oxide, hafnium oxide, and the like, and organic materials such as perylene or other polymeric compounds. Combinations of more than one material may be used, and the dielectric layer may comprise more than one sublayer, and the various sub-layers may be formed from different materials. As discussed in more detail below, the dielectric layers may also be formed from a photoresist. The material used should be impermeable to ions and electrons and (since it will be subjected to the high electric fields used to drive electrophoretic displays, which are typically of the order of $10^6$ V/m) should have a high dielectric strength, preferably at least about $10^7$ V/m. The optimum thickness for the dielectric layer is dependent upon its dielectric constant, as discussed in more detail below.

As noted above, incorporation of a dielectric layer into an electrophoretic display such as that shown in FIG. 1 introduces a capacitor in series with the electrophoretic fluid between the two electrodes, and when the two electrodes are held at the same potential after a transition, discharge of this capacitor may lead to enough electric current flowing through the electrophoretic medium to cause an objectionable shift in optical state, the so-called electro-optical kickback. Using an apertured dielectric layer in accordance with the present invention in effect introduces a resistor (formed by the apertures) in parallel with a capacitor (formed by the non-apertured portions of the dielectric layer), this RC arrangement being in series with the electrophoretic fluid.

The size and number of the apertures in the dielectric layer control the current flow through the electrophoretic medium and hence the rate of relaxation of electrical charge stored in the capacitance of the dielectric layer. The ability to control this electrical relaxation time improves the performance of electrophoretic displays by limiting electro-optical kickback and buildup of remnant voltage, and controlling local electric fields with the display. If the areas of the apertures in small relative to the total area of the dielectric layer, the RC time for discharging the dielectric layer can be made much shorter than that for discharging the interfacial double layer formed within the ionically-doped conductive polymeric adhesive typically used in electrophoretic displays.

Figure 2:
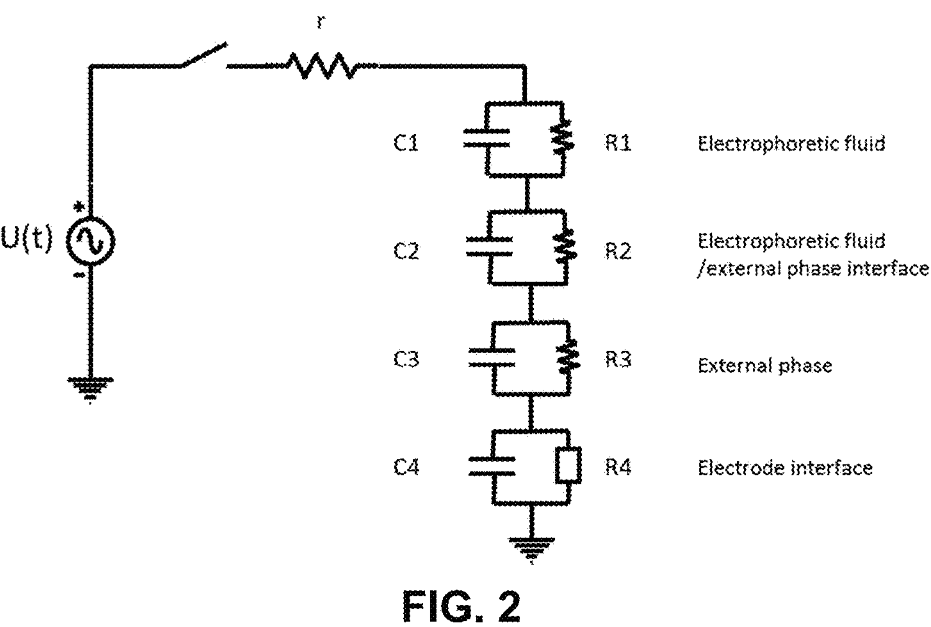
FIG. 2 is a circuit diagram of a model of a prior art electrophoretic display lacking a dielectric layer.
Figure 3:
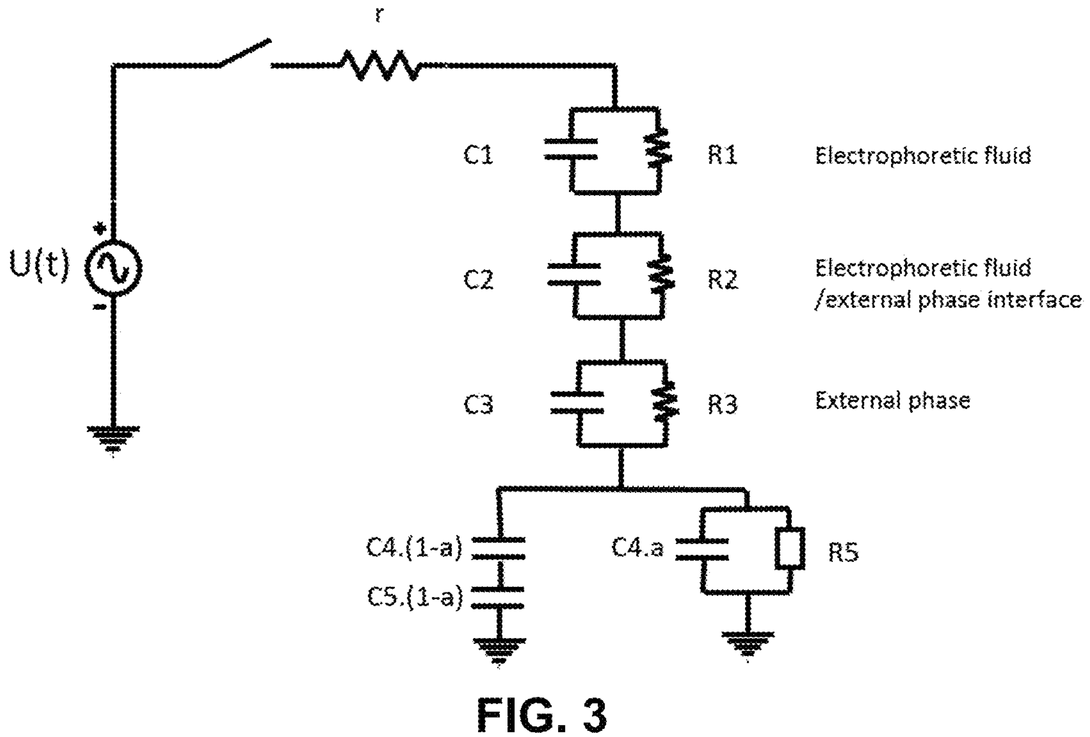
FIG. 3 is a circuit diagram, similar to that of FIG. 2, but of a model of an electrophoretic display of the present invention having a dielectric layer provided with a plurality of apertures.

Those skilled in electrophoretic display technology are aware that the electrical behavior of electrophoretic displays can be modelled as a series of Voigt elements (i.e., parallel arrangements of storage and loss components) corresponding to the various layers and interfaces between the electrodes. Although these models are oversimplifications of the electrical behavior of actual electrophoretic displays, they do provide a useful basis for understanding the effect of introducing additional layers into the display, such as the apertured dielectric layer used in the present invention. FIG. 2 is a circuit diagram of such a model of a prior art encapsulated electrophoretic display lacking any dielectric layer adjacent an electrode, while FIG. 3 is a circuit diagram of an encapsulated electrophoretic display of the present invention having an apertured dielectric layer adjacent one electrode.

As shown in FIG. 2, the prior art encapsulated electrophoretic display (whether encapsulation is in microcells as shown in FIG. 1, in discrete capsules or as a polymer-dispersed electrophoretic medium is irrelevant for present purposes) is modelled as a stack of Voigt elements comprising an element C1/R1 for the electrophoretic medium itself, an element C2/R2 representing the interface between the electrophoretic medium itself and the external phase, an element C3/R3 representing the external phase, and an element C4/R4 representing the interface between the external phase and the electrode. (The term "external phase" is used in its conventional meaning with regard to electrophoretic displays to denote all layers comprising the display other than the electrophoretic medium itself. Thus, in the display shown in FIG. 1, the term "external phase" includes not only the polymeric layer 116, dividing walls 112 and sealing layer 110 which enclose the electrophoretic medium, but also the adhesive layer 108.)

Typical electrophoretic medium (the "internal phase"), comprising solvents with low dielectric constants (about 2) have a bulk capacitance C1 in the range of 0.02-5 nF/cm$^2$ and a resistance R1 of about 1-10 MΩ·cm$^2$ when in layers having a thickness in the range of 10-25 μm. The capacitance C2 at the interface between the electrophoretic fluid and the external phase is more difficult to estimate, but may be approximated by combining two capacitors in series, the dielectric thickness of each being approximated by the Debye length in each medium (i.e., the internal and external phases). This gives an estimate for C2 of about 10-100 nF/cm$^2$. The resistance R2 of the interface, corresponding to passage of ions across the boundary, is difficult to estimate. If this resistance is too high, the display will show electrical (and probably optical) kickback. The value of R2 that gives best agreement with electrical current measurements when driving a typical display is about the same as the resistance of the external phase, i.e., in the range 1-10 MΩ·cm$^2$. The bulk capacitance of the external phase, C3, assuming that it comprises a polymeric material of dielectric constant about 10 containing mobile ions, is estimated to be about 0.1-10 nF/cm$^2$. The resistance of the external phase, R3, is in the range 1-10 MΩ·cm$^2$. Finally, the interfacial capacitance C4 at the electrode boundary is estimated from the Debye length in the doped polymeric external phase. Its conductivity is about the same as that of the internal phase but the mobility of the charge carriers is much lower, since the viscosity of the polymer is orders of magnitude higher than that of the electrophoretic solvent. As a result the concentration of ions must be much higher in the external phase than in the internal phase and consequently the Debye length much less. The capacitance of the interface is estimated as in the range of 2-20 nF/cm$^2$, i.e., much larger than any other capacitance in the system. It is possible that electrochemical reactions at this interface might produce a "resistive" path R4 in FIG. 2, although this will not be a simple resistor. This path is undesired as it may lead to eventual degradation of the electrodes, as described above. Methods to mitigate electrochemical currents in electrophoretic displays are discussed in detail, for example, in International Patent Application WO 2014/110394 A1.

The time required to produce an image is related to the RC time constant for charging the capacitor C2, which is typically less than 1 second. The RC time constant for charging the capacitance C4 at the electrode interface is however much longer, typically on the order of 100 seconds, so C4 will only be partially charged at the time that C2 is fully charged. The voltage across C4 is an approximation of the "remnant voltage" stored in the display. In a DC-balanced waveform this remnant voltage is mostly discharged, but in a non-DC-balanced waveform it will persist. Because the RC time for charging and discharging C4 is so long, it is not practical to fully discharge this capacitance by placing both electrodes at the same potential. Even worse, if there is a possibility of discharge of C4 by means of the electrochemical reactions indicated as R4 in FIG. 2, there may also be a slow electrochemical degradation of the electrodes in the undriven display caused by the remnant voltage after an update.

The circuit diagram in FIG. 3 for an electrophoretic display of the present invention having an apertured dielectric layer adjacent one electrode has Voigt elements C1/R1, C2/R2 and C3/R3 identical to those shown in FIG. 2. However, if the proportion of the area of the dielectric layer occupied by the apertures is a, the external phase/electrode interface has to be modelled as a combination, in parallel, of (a) a Voigt element C4.*a*/R5, representing the apertures themselves (in the apertures there is a possibility of an electrochemical current represented by R5); and (b) a capacitor C4.(1-*a*) (representing the non-apertured portion of the interface) in series with a capacitor C5.(1-*a*) (representing the capacitance of the dielectric layer itself)—obviously, there is no possibility of electrochemical current in this region, so no resistive element is needed.

Figure 4:
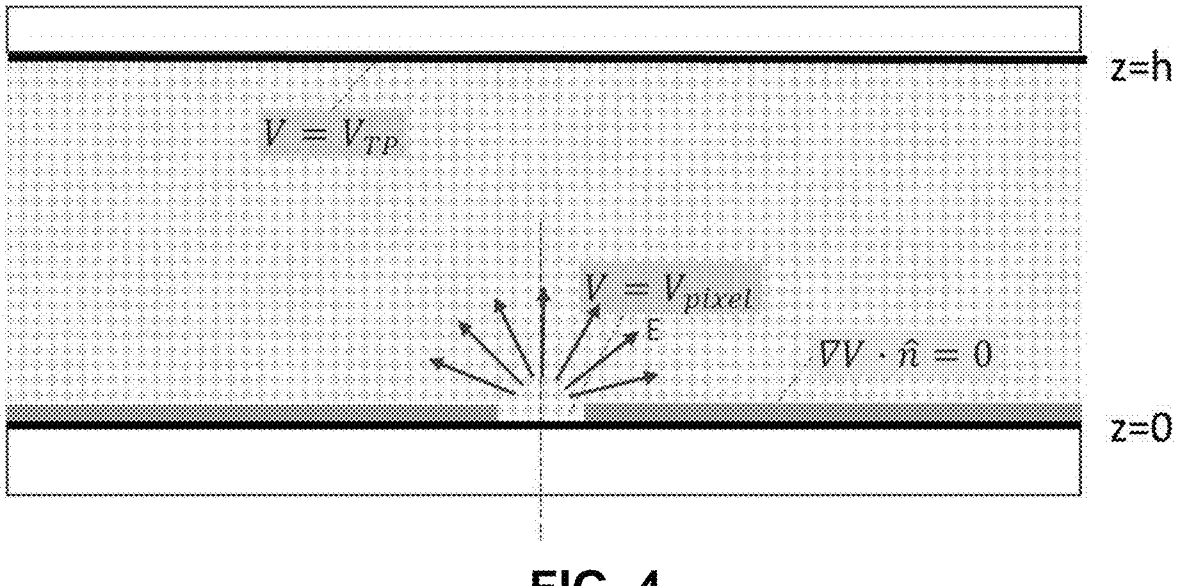
FIG. 4 is a schematic cross-section through part of an electrophoretic display of the present invention showing a single aperture through a dielectric layer, and illustrates the method used to calculate the resistance of the apertured dielectric layer.

In order to determine R5, it is necessary to consider the resistance of a sheet of dielectric material perforated with a single aperture in contact with a conductive layer, as shown in FIG. 4. This resistance R can be estimated by calculating the flux of current in the conductive layer through the aperture (i.e., by solving Laplace's equation for the geometry illustrated in FIG. 4). For the case in which the radius of the aperture is much less than the distance between the electrodes, it can be shown that:

$$I=2\pi r_a\sigma(V_{TP}-V_P),$$

where l is the effective compliance, $r_a$ is the radius of the aperture, and $V_{TP}$ and $V_P$ are the potentials of the top plane (front) and pixel electrodes respectively.

Thus, the resistance is inversely proportional to the radius of the aperture and to the conductivity of the overlying layer. For a plurality of n similar apertures, the resistance of the combination of the apertured dielectric layer and the overlaying conductive material is the harmonic sum of the resistances associated with each individual aperture. Varying the aperture radius and density can thus be used to adjust the RC time constant for electrical relaxation of the capacitor formed by the dielectric layer. This capacitance will depend on the dielectric constant of the dielectric layer and inversely on its thickness.

Figure 5:
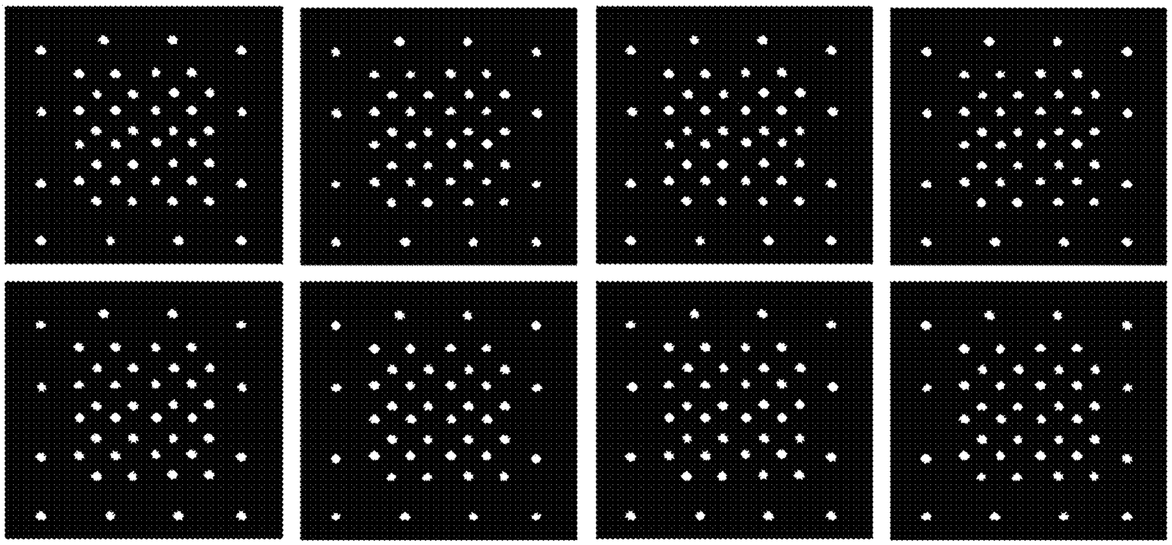
FIG. 5 is a top plane view of the backplane of an electrophoretic display of the present invention showing the distribution of apertures over each electrode.

It is not necessary that the aperture density be constant over the whole area of the dielectric layer, nor that the dimensions of all the apertures be the same. Therefore it is possible to control the local electrical relaxation time of the dielectric layer by suitable choice of aperture patterns in particular areas. In regions with lower aperture density, this relaxation time will be longer. FIG. 5 is a top plan view of a pixel array with an overlying apertured dielectric layer with varying aperture density. The dielectric layer associated with each pixel has a central region and a peripheral region, the number of apertures per unit area being greater in the central region than in the peripheral region. The longer relaxation time provided by the lower aperture density in the peripheral regions may allow better control of fringing fields and thus reduced edge artifacts in the display.

Figure 6:
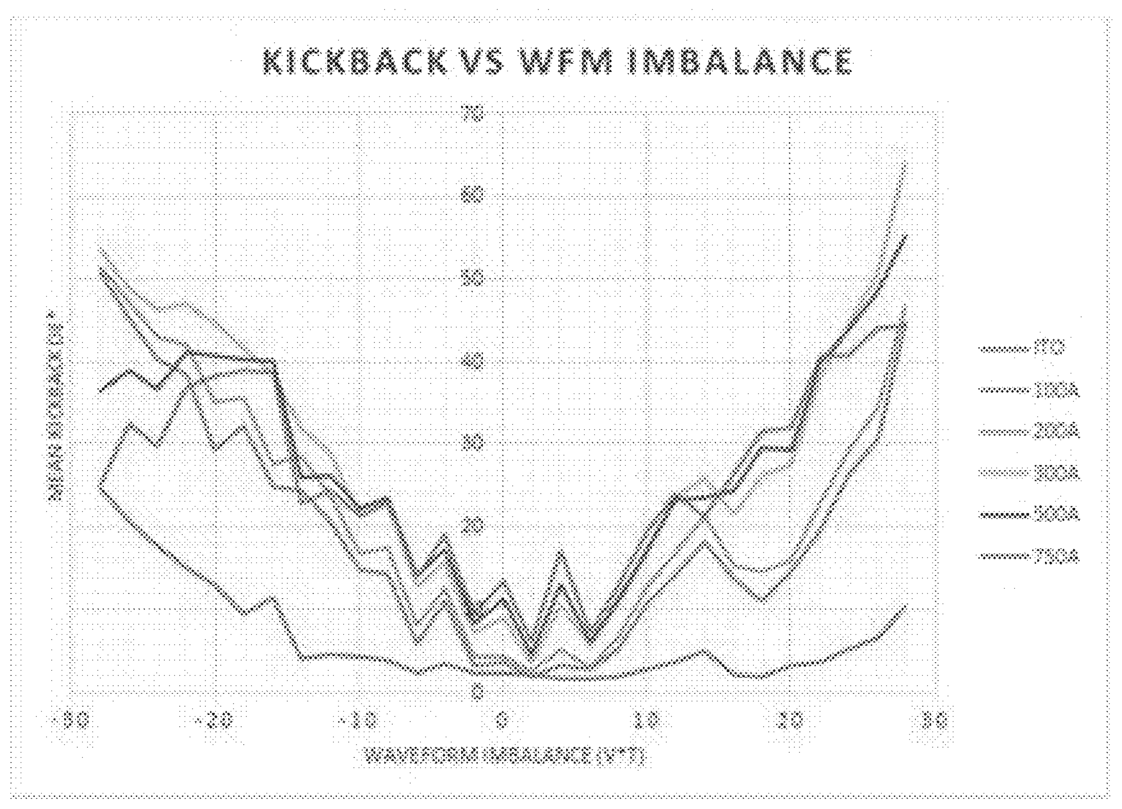
FIG. 6 is a graph showing the optical kickback of a full color electrophoretic display of the present invention as a function of the thickness of the dielectric layer.
Figure 7:
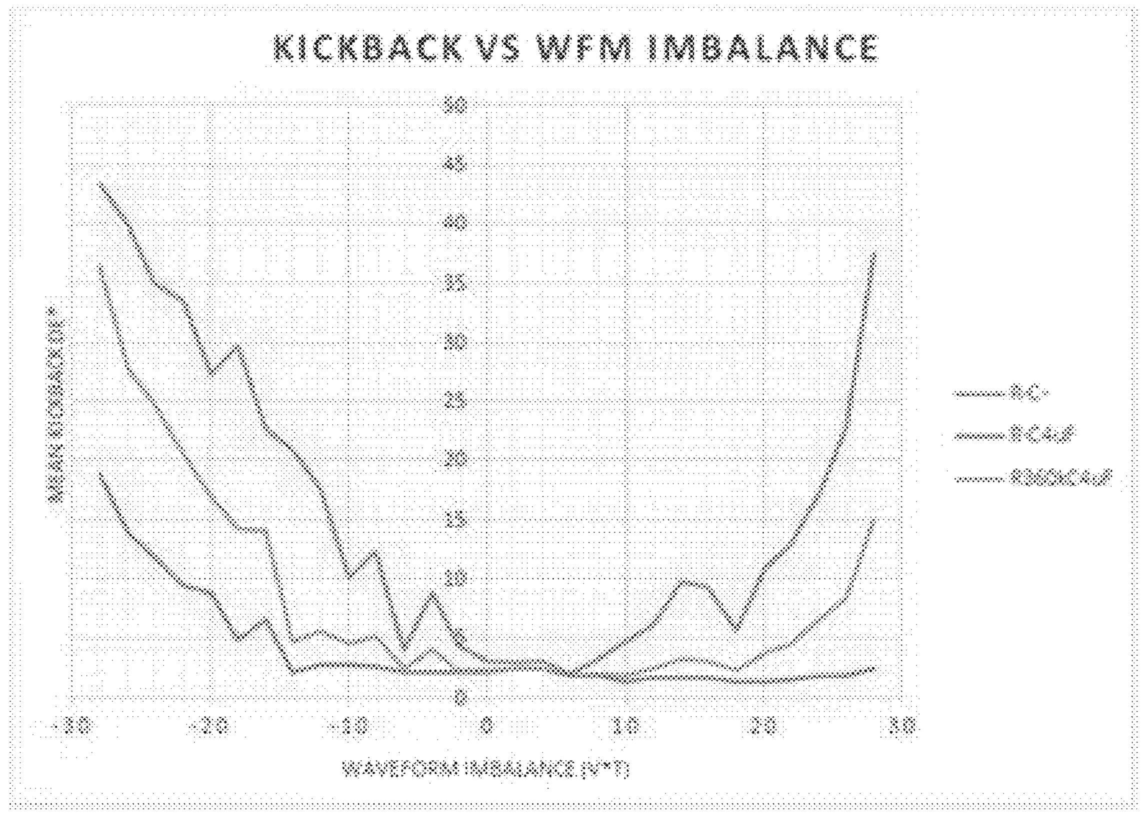
FIG. 7 is a graph similar to FIG. 6 but showing the optical kickback of a similar full color electrophoretic display lacking a dielectric layer but an external parallel resistor and capacitor in series with the display to mimic the effect of an apertured dielectric layer.

As already mentioned, by allowing relaxation of charges stored on the capacitor provided by the dielectric layer, the present invention can mitigate optical kickback in electrophoretic displays. FIG. 6 shows the optical kickback (in dE* units) of a full color electrophoretic display having non-apertured dielectric layers of various thicknesses. FIG. 7 shows the optical kickback of the same electrophoretic display with the same electrophoretic medium but lacking a dielectric layer, and with an external parallel capacitor/resistor in series with the display to mimic the effect of an apertured dielectric layer, the capacitor being chosen to correspond to a dielectric layer of capacitance 300 nF/cm$^2$. When the resistor is less than about 360 kΩ, corresponding to about 7 MΩ·cm$^2$, the optical kickback (grey line) can be mitigated to be between the value with no external capacitor (blue line) and no external resistor (orange line).

As shown in FIG. 1, the conductive material, which lies on the opposed side of the dielectric layer from the electrode, may be an adhesive layer, which may be doped with ionic materials to enhance its conductivity. It may be desirable to provide more than one layer of conductive material adjacent the apertured dielectric layer, with each of the layers of conductive material having a different conductivity. The conductivity of the layer in contact with the dielectric layer (and which thus fills the apertures in the dielectric layer) may be adjusted so that the combination of this layer and the dielectric layer achieves desired electrical properties, whereas other layers spaced from the dielectric layer may be optimized for other properties, for example adhesion or compliance.

As will be apparent from the discussion of FIG. 4 above, in the display of the present invention an electrochemical current flows through the apertures in the dielectric, and it may be necessary to protect the underlying electrode material from oxidative or reductive damage. For example, in the region of the apertures the electrode material (typically a metal) might be made thicker than would conventionally be the case. Alternatively, the conductive layer in contact with the dielectric layer may contain electron donors or electron acceptors, as known in the art.

The apertured dielectric layer may be formed by any convenient process depending upon the dielectric material used. For example, if the dielectric layer is inorganic, the apertures may by formed by laser ablation. However, given the large number and small size of the apertures required in practice (for example, FIG. 5 shows a dielectric layer having 44 apertures per pixel, or more than 20 million apertures on a 800×600 display, with apertures typically 1-5 μm in diameter), formation of the apertures by photolithography is often the most convenient method. The electrode which is to carry the apertured dielectric layer is coated with a photoresist, which is then imagewise exposed to radiation and washed to form the apertures. The electrophoretic medium and any intervening layers, such as adhesives, are then disposed adjacent the exposed photoresist. Such a photoresist-based process for formation of apertured dielectric layers is well adapted for mass production of electrophoretic displays. Photoresists having appropriate dielectric properties for use in the apertured dielectric layers are available commercially, for example, the cinnamate class of photoresists. U.S. Pat. No. 7,981,989 describes a polymeric adduct of poly(hydroxyethyl methacrylate) and cinnamoyl chloride having, in a capacitor configuration, a leakage current density of $2\times10^{-9}$ A/cm$^2$ under a field of 2 MV/cm and $1\times10^{-8}$ A/cm$^2$ under a field of 4 MV/cm, a capacitance of 6.0 nF/cm$^2$ in a layer of 460 nm thickness, and a breakdown voltage greater than 200 Volts. Similar photo-patternable organic dielectric materials are described in U.S. Pat. Nos. 8,338,555; 8,937,301; 9,082,981; 9,341,948; 9,704,997; 9,923,158; 10,147,895 and 10,551,745. The variety of available photo-patternable polymeric dielectric materials allow precise tailoring of dielectric properties to optimize dielectric layer performance. These dielectric materials are solution processible, and commercialization of these types of materials has already been demonstrated for the production of organic thin film transistor devices using solvents and processes compatible with existing TFT manufacturing lines.

From the foregoing, it will be seen that the present invention can provide electrophoretic displays having controlled currents and reduced electro-optical kickback, thereby permitting such displays to be driven with DC imbalanced waveforms without damage to the displays.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. An electrophoretic display comprising:

an electrophoretic medium comprising a plurality of electrically charged particles disposed in a fluid and capable of moving through the fluid on application of an electric field to the electrophoretic medium;

a plurality of first electrodes disposed adjacent the electrophoretic medium and arranged to apply an electric field thereto, wherein each of the plurality of first electrodes has a central region and a peripheral region;

a voltage control means to vary the potential of the plurality of first electrodes independently of one another;

a dielectric layer disposed between the electrophoretic medium and the plurality of first electrodes; and a second electrode disposed on the opposite side of the electrophoretic medium from the plurality of first electrodes adjacent the dielectric layer, wherein the dielectric layer is provided with a plurality of apertures extending through the dielectric layer to the central region and peripheral region for each of the plurality of first electrodes, the apertures extending to the central region having a size and/or number of apertures per unit area greater than a size and/or number of apertures per unit area for the plurality of apertures extending to the peripheral region.

2. The electrophoretic display of claim 1 further comprising a second dielectric layer disposed between the electrophoretic medium and the second electrode, the second dielectric layer having at least one aperture extending therethrough.

3. The electrophoretic display of claim 1 wherein the dielectric layer has a dielectric strength of at least about $10^7$ V/M.

4. The electrophoretic display of claim 1 wherein the dielectric layer has a thickness in the range of about 10 to 100 nm and the at least one aperture is substantially circular and has a diameter in the range of about 1 to 5 μm.

5. The electrophoretic display of claim 1 wherein the dielectric layer is formed from any one or more of silicon dioxide, silicon nitride, a metal oxide, or an organic material.

6. The electrophoretic display of claim 5 wherein the dielectric layer is formed from any one of more of zinc oxide, tantalum oxide, hafnium oxide, perylene or a photoresist.

7. The electrophoretic display of claim 1 further comprising an adhesive layer disposed between the dielectric layer and the electrophoretic medium.

8. The electrophoretic display of claim 7 wherein the adhesive layer is doped with an ionic material to reduce its electrical resistance.

9. The electrophoretic display of claim 1 wherein the electrically charged particles and the fluid are confined within a plurality of capsules or microcells.

10. The electrophoretic display of claim 1 wherein the electrically charged particles and the fluid are present as a plurality of discrete droplets surrounded by a continuous phase comprising a polymeric material.

* * * * *